United States Patent
Matuschek et al.

(10) Patent No.: US 9,214,758 B2
(45) Date of Patent: Dec. 15, 2015

(54) HERMETIC HOUSING ARRANGEMENT

(71) Applicant: Liebherr-Elektronik GmbH, Lindau (DE)

(72) Inventors: Daniel Matuschek, Kissleg (DE); Hubert Grau, Weissensberg (DE)

(73) Assignee: Liebherr-Elektronik GmbH, Lindau (DE)

( * ) Notice: Subject to any disclaimer, the term of this patent is extended or adjusted under 35 U.S.C. 154(b) by 187 days.

(21) Appl. No.: 13/973,599

(22) Filed: Aug. 22, 2013

(65) Prior Publication Data

US 2014/0060875 A1  Mar. 6, 2014

(30) Foreign Application Priority Data

Aug. 31, 2012 (DE) .......... 10 2012 017 357

(51) Int. Cl.
| | |
|---|---|
| *H05K 5/06* | (2006.01) |
| *H01R 13/533* | (2006.01) |
| *H01R 13/52* | (2006.01) |
| *H01R 13/74* | (2006.01) |

(52) U.S. Cl.
CPC .......... *H01R 13/533* (2013.01); *H01R 13/5202* (2013.01); *H01R 13/748* (2013.01); *H05K 5/06* (2013.01); *H05K 5/061* (2013.01); *H01R 13/5213* (2013.01)

(58) Field of Classification Search
USPC ............................................ 174/50.52, 50.5
See application file for complete search history.

(56) References Cited

U.S. PATENT DOCUMENTS

| | | | |
|---|---|---|---|
| 4,529,257 A | 7/1985 | Goodman et al. | |
| 5,326,273 A | 7/1994 | Kamon et al. | |
| 5,688,131 A | 11/1997 | Byfield, Jr. | |
| 6,217,737 B1 | 4/2001 | Baumann | |
| 6,747,542 B1 * | 6/2004 | Hoehn | 338/50 |
| 2002/0009909 A1 | 1/2002 | Kondoh | |
| 2005/0269120 A1 | 12/2005 | Guarino et al. | |

FOREIGN PATENT DOCUMENTS

| | | |
|---|---|---|
| DE | 3405956 A1 | 8/1984 |
| DE | 102005040425 A1 | 3/2006 |
| DE | 102006037355 B3 | 1/2008 |
| DE | 602005005860 T2 | 5/2009 |
| JP | 2000277203 A | 10/2000 |
| JP | 2007073269 A | 3/2007 |

* cited by examiner

*Primary Examiner* — Dhirubhai R Patel
(74) *Attorney, Agent, or Firm* — Alleman Hall McCoy Russell & Tuttle LLP

(57) ABSTRACT

The present disclosure relates to a housing arrangement, in particular to a hermetic housing arrangement, having at least one housing for connecting a plug-in connector, wherein the housing arrangement has at least one seal. The housing arrangement in accordance with the present disclosure is characterized in that the at least one seal can be placed in at least one opening provided in the housing and/or in an opening provided in a plug flange of the plug-in connector and designed as a milled portion.

19 Claims, 2 Drawing Sheets

//  HERMETIC HOUSING ARRANGEMENT

CROSS REFERENCE TO RELATED
APPLICATION

This application claims priority to German Patent Application No. 10 2012 017 357.1, entitled "Hermetic Housing Arrangement," filed Aug. 31, 2012, which is hereby incorporated by reference in its entirety for all purposes.

TECHNICAL FIELD

The present disclosure relates to a housing arrangement, in particular to a hermetic housing arrangement, having at least one housing for connecting at least one plug-in connector.

BACKGROUND AND SUMMARY

Hermetically sealed housings are used to protect the parts located therein from undesired external influences. Hermetic housings are likewise used for the protection of high-quality and sensitive microelectronics. These housings establish the connection of internal components to the outside environment by, for example, glazed vias. The components in this respect are securely protected against any type of external influences such as radiation, sparks, gas and air as well as liquid media.

Hermetically and electromagnetically sealed housings for the protection of sensitive electronics are above all used in aerospace electronics as well as in defense technology. It is known to accommodate hybrid circuits of passive and active electronic components in a metallic housing and to close it in a sealed manner while filling with inert gas.

Different sealing concepts are known such as the water-resistant housing structure disclosed in the publication DE 10 2005 040 844 A1. This housing structure is admittedly only sealed against fluids, but not against gases, which is in particular of special importance in aerospace applications due to the extreme environmental influences.

An electronic box of an aircraft can have a very large capacity. A large sealing surface thus results due to the plurality of plugs and covers. The sealing concept must satisfy very high and atypical demands due to the pressure differences between the internal pressure and the external pressure of several bars which arise in the air.

In the previously known hermetic housing arrangements which were in particular used in aerospace technology, there were continually problems in the past not only with respect to bonding and leak-tightness, but also problems with respect to corrosion. Previously, elastically deformable plastics such as fluorosilicone rubber (FVMQ) were used as sealing material for these known housing structures. As is known, fluorosilicone combines the good high-temperature properties and low-temperature properties of silicone with good fuel resistance and oil resistance. Fluorosilicone O rings as seals are, however, above all used in fuel systems at temperatures up to 177° C. as well as in applications in which the resistance of silicone to dry heat is demanded. Fluorosilicone is as a rule only recommended for static applications due to the relatively low tear strength, the high friction and the insufficient wear properties of this material.

U.S. Pat. No. 4,960,391 describes a classical sealing solution of hermetic plug connectors in which an O ring seal, which is produced from elastomer as a rule, has to be let into a groove. It is of disadvantage in this solution that crevice corrosion and contact corrosion forms at the plugs and at the housing. The risk of crevice corrosion is present at the housing cover. It was proposed in this document to use a paste which is intended to serve as corrosion protection, but does not ensure any complete protection. A further disadvantage of such solutions is that the O ring is very sensitive due to the pressing. Too high a pressing of the O ring seal results in damage and thereby to the failure of the seal. Too low a pressing, in contrast, has the consequence that the desired leak-tightness cannot be achieved.

An alternative to the known O ring seals can be found in the static sealing elements such as metal C rings which are, however, only suitable with restrictions for a use in lightweight housings, which are produced from aluminum as a rule, and are very sensitive. Furthermore, this seal cannot be manufactured for more complex shapes.

It is already known with respect to the corrosion resistance of the housing to provide it with an anti-corrosion coating. The surface protection of the metal housing, however, has to have good local conductivity to be able to satisfy existing demands such as lightning, bonding as well as electromechanical compatibility (EMC). The previously known conductive surface coatings only provide a moderate corrosion protection. It is, however, not practicable from a technical production aspect to provide the surface up to the round seal with a non-conductive high corrosion protection and to apply a conductive surface protection after the attachment of the seal.

Alternatively to the previously known seals such as metal seals and FVMQ, no sealing technologies are known which satisfy the high demands on such housings, namely gastight with a very low steam permeation, vibration resistance, media resistance and long-term stability. Such housings, which are used in aeronautic technology, have to be very temperature resistant for this reason.

It is therefore the object of the present disclosure to provide a housing structure which can in particular be used in aeronautic technology, which is hermetically sealed, on the one hand, and which significantly reduces the arising of corrosion, on the other hand, which improves leak-tightness and steam permeation and which does not negatively influence EMC behavior and bonding behavior.

This object is achieved in accordance with the present disclosure by a housing arrangement having the features of claim 1 as well as by a sealing structure having the features of claim 10.

The housing arrangement in accordance with the present disclosure which has at least one housing for connecting a plug-in connector is provided with at least one seal which is placed in an opening provided in the housing and/or in a plug flange of the plug-in connector and which comprises a milled portion. In the solution in accordance with the present disclosure, a groove is thus no longer necessary in which the seal is placed, but only a milled portion in the plug flange or in the housing is required in which the seal is precisely attached. With this arrangement, the leak-tightness and the handling (the production costs) are noticeably improved and the corrosion formation is additionally considerably reduced since here a more or less punctiform sealing takes place and not along the whole connection surface between the housing and the plug as in the above-named solutions known from the prior art. The milled portion allows a defined pressing of the seal and a good handling in the installation of the seal.

In accordance with the present disclosure, the seal is a compressible seal which has an elastic portion. The leak-tightness can be substantially improved with this seal in comparison with the previously known seals of fluorosilicone rubber, with the corrosion formation additionally able to be considerably reduced. The compressible seal in accordance with the present disclosure protects the structure from ingressing media and thus makes an additional corrosion protection superfluous.

The housing may have a cover, with the at least one opening, which is formed as a milled portion, is provided at the connection of the cover to the housing. The milled portion can be formed both at the upper region of the housing adjacent to the cover and at the lower region of the cover adjacent to the housing. The housing can thus not only be sealed in the region of the plug-in connection, but also in a gas-tight manner at the cover. The region of the plug connection to the housing and of the connection of the cover to the housing is protected better against corrosion by the structure in accordance with the present disclosure, wherein the electromagnetic compatibility and the bonding can be improved.

The seal can have a geometry of any desired complexity and can be pressed locally more so that a high leak-tightness is ensured.

An embodiment of the present disclosure provides that a surface coating is applied in the form of a non-conductive and resistant corrosion protection before the installation of the seal. The surface coating may be applied to the housing or to the plug at the environmental side up to the regions on which the seal lies.

The bonding connection between the plug connector and the housing may be realized with a conductive surface coating, e.g. a chromatization.

The respective coatings may be applied in the at least one cut-out provided in the housing and/or in the cover of the housing.

The structural principle of a seal at a housing cover is the same as the structure at the plug-in connectors. The seal may be formed as a flat seal and can also be used in complex housing contours. A cut-out in the cover or in the housing serves as an installation aid for the introduction of the seal in accordance with the present disclosure and guarantees a defined pressing of the seal. In the case of high leak-tightness demands, the seal can be pressed locally more in ring shape by a stress point.

The compressible sealing structure in accordance with the present disclosure as claimed in claim 12 protects the whole housing from ingressing media and thus makes an additional corrosion protection superfluous. The surface coating at the surfaces adjacent to the seal can be applied in the form of a non-conductive and resistant corrosion protection, wherein the bonding connection and EMC connection between the plug and the housing can be realized by a conductive surface coating, e.g. a chromatization.

The present disclosure will now be explained in more detail with reference to an embodiment and to the drawing.

DETAILED DESCRIPTION

Figure 1:
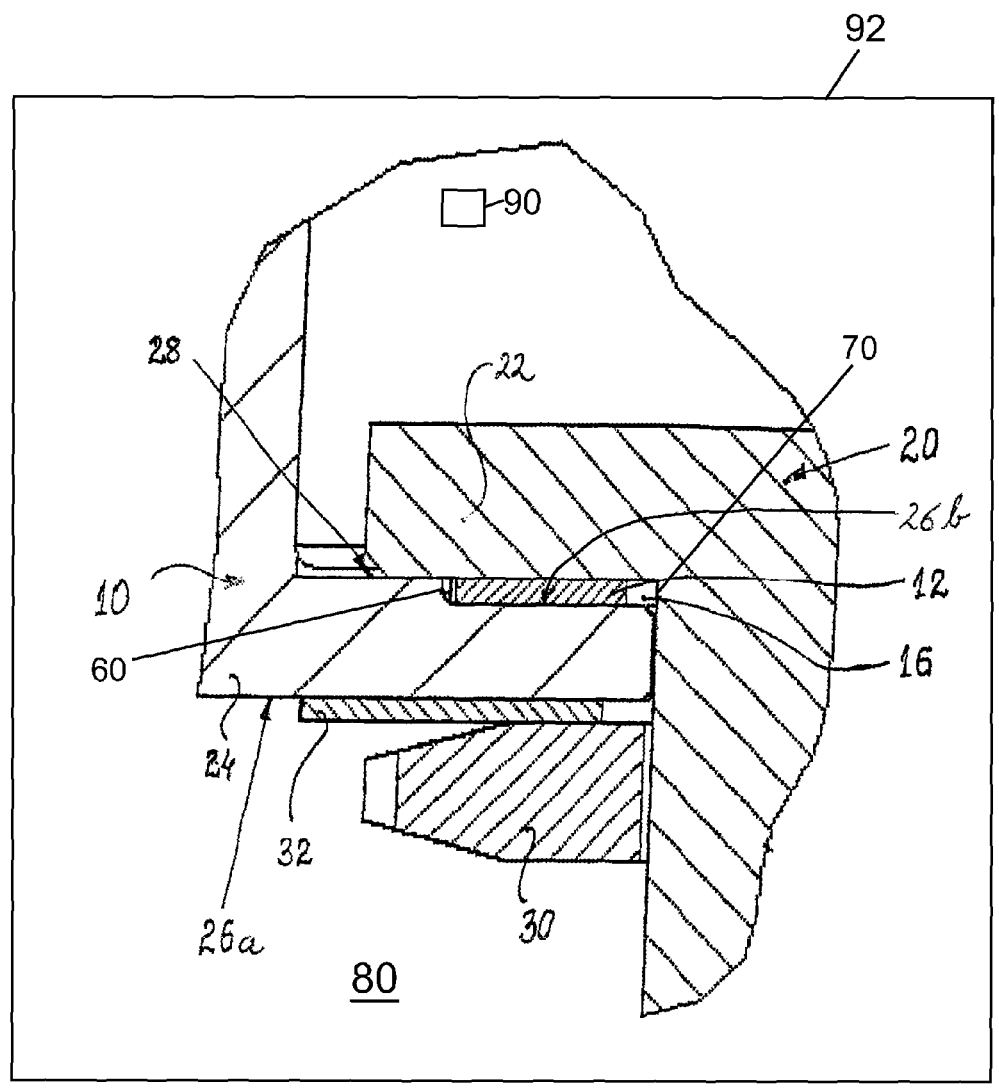
FIG. 1 shows a partial sectional representation of a housing arrangement in accordance with the present disclosure in the region of the connection of a plug at a housing in accordance with an embodiment.

FIG. 1 shows a sectional view of a housing arrangement in accordance with the present disclosure with a housing 10 in lightweight construction with a sealing structure in accordance with the present disclosure at the connection of a plug-in connector 20 with a seal 12. The seal 12 is configured as a compressible shaped packing which has an elastic portion positioned in a milled portion 16, the milled portion 16 provided in the border region between the housing 10 and the plug flange 22. Milled portion 16 includes vertical side walls 60 provided in the housing, as well as vertical side walls 70 provided in plug flange 22 of plug-in connector 20. The elastic portion may be the entire seal in one example, or only a portion of the seal, such as an exterior side (e.g., the side facing the housing, and/or the side facing the connector) of the seal, in another example. The seal 12 is introduced into the milled portion 16 by pressing, wherein the plug-in connector 20 is shown in the connected state in the embodiment shown in FIG. 1. The plug has a screw nut 30 for screwing the plug-in connector 20 in the housing 10.

In this embodiment, a washer 32 is provided between the screw nut 30 of the plug-in connector 20 and an adjacent housing flange 24 for the better connection of the plug in the housing 10. To ensure an increased corrosion protection, a surface coating 26a, 26b, which provides an electrically insulating corrosion protection, is applied at the environmental (e.g., ambient) side 80 and thus on the surface 26a adjacent to the washer 32 and on the surface 26b of the housing flange 24 adjacent in the milled portion 16 of the seal 12, wherein the milled portion is shaped as a cut-out. This surface coating 26 can be applied in the form of a non-conductive and resistant corrosion protection such as a sulfuric acid anodization.

An electrically conductive corrosion protection is applied to the surface of the housing flange 24 adjacent to the milled portion 16 at the housing 10. The milled portions may be rectangular in cross-section. The bonding connection between the plug-in connector 20 and the housing 10 is thus provided with a conductive surface coating 28 such as a chromatization.

The milled portion can be provided in the adjacent plug flange 22 instead of in the housing 10. The compressible shaped packing in accordance with the present disclosure can in this respect likewise be placed into the milled portion by pressing as in the embodiment shown in FIG. 1, with a high hermeticity being ensured.

The seal 12 may be in face-sharing contact with the housing 10 on one side, and with the connector 20 on the opposite side, with the milled portion retaining the seal. Additionally, the housing 10 and the connector 20 may also be in face-sharing contact outside of the seal, where each of the housing and the connector wrap around each other via two oppositely positioned L-shaped regions.

Figure 2:
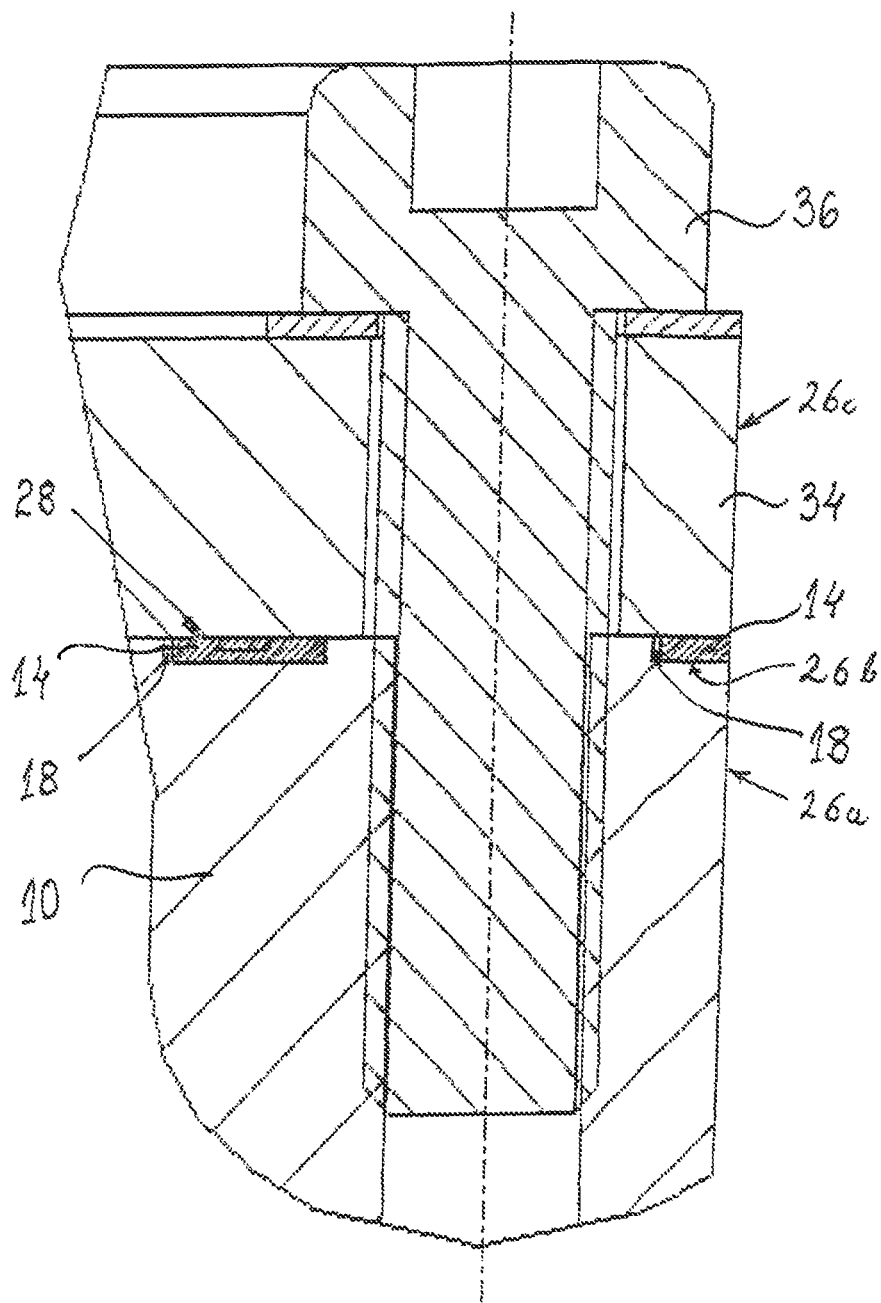
FIG. 2 shows a partial sectional representation of a housing arrangement in accordance with the present disclosure in the region of a housing cover with a fastening screw and with the seal structure in accordance with the present disclosure.

FIG. 2 shows a partial sectional representation of a housing arrangement in accordance with the present disclosure in the region of a housing cover 34 which is fastened to the housing 10 by means of a screw 36. In this embodiment, a milled portion 18 is provided which encompasses the screw 36 and is provided at the outer margin of the housing 10 which is adjacent to the housing cover 34.

As can be seen from FIG. 2, the seal 14 in this embodiment surrounds the screw 36, with it having to be noted at this point that the cover 34 can also be fastened to the housing 10 with the aid of a plurality of screws. It is advantageous in this respect that the seal 14 is provided in a region close to the screw 36 to ensure a high hermeticity. The milled portions 18 are formed in this embodiment at the upper margin adjacent to the cover 34 of the housing 10, with them also being able to be provided in the cover 34 itself.

It is understood that the seal 14 in accordance with the present disclosure can be placed in one milled portion or also in a plurality of milled portions 18 in the region of the cover 34 by pressing. A conductive surface coating 28 is, as in the embodiment shown in FIG. 1, applied to the points at the housing 10 and at the cover 34 disposed inwardly at the housing and adjacent to the seal. An electrically insulating surface coating 26a, 26b, 26c having good corrosion protection properties is provided in this embodiment at the environmental side and thus on the outer housing side 26a, the outer cover side 26c and in the milled portion 18 (26b).

The arising of corrosion is significantly reduced, the leak-tightness and steam permeation is improved and the electromagnetic behavior and the bonding behavior are no longer negatively influenced by the extreme external conditions by the seal design in accordance with the present disclosure for hermetic housings and plugs which can in particular be used in aerospace applications.

The whole housing is gastight, i.e. hermetically sealed, by the concept in accordance with the present disclosure, and indeed both at the plugs and at the cover, where present. An additional corrosion protection at the housing or at the cover becomes superfluous due to the application of a surface coating at the points adjacent to the seal.

In the depicted example of FIG. 2, the seal 14 has an elastic portion indicated by the solid interior line.

In one example, the hermetic housing illustrated in FIGS. 1-2 may be used for the protection of high-quality and sensitive microelectronics, the microelectronics 90 contained within the housing 10. The housing may establish an improved electrical connection of internal components, such as the microelectronics, to the outside environment 80 while maintaining a proper seal. The components in this respect are thus securely protected against any type of external influences such as radiation, sparks, gas and air as well as liquid media, where there is no groove in which the seal is placed, but only a milled portion in the plug flange or in the housing is required in which the seal is precisely attached. The milled portion allows a defined pressing of the seal and a good handling in the installation of the seal.

In one or more of the disclosed embodiments, the system described herein provide a hermetically and electromagnetically sealed housings for the protection of sensitive electronics positioned in an aircraft 92, although it may be placed in other locations as well. In one example, the electronics 90 may include hybrid circuits of passive and active electronic components, where the housing is closable in a sealed manner and then filled with inert gas. For example, the housing 10 may be an electronic box of an aircraft requiring a large sealing surface having a plug-in connectors of the type shown in FIGS. 1-2. Further, there may be significant pressure differences between the external, environmental pressure at 80, and the pressure in the internal area of the housing in which the electronics 90 are positioned.

In one particular example embodiment that may be formed with the system of FIGS. 1 and/or 2, the seal 12, in its installed state (e.g., when the housing and connector are in a fully and complete connected position), is compressed into a geometry that is only partly deformed due to its compressibility. The deformation may include plastic deformation. However, even in this state, the seal retains elasticity and thus is not broken or cracked. This is due to the particular geometry of the milled portion.

The invention claimed is:

1. A housing arrangement, having at least one housing for connecting a plug-in connector, wherein the housing arrangement has at least one seal, wherein the at least one seal comprises a compressible material having an elastic portion and positioned in a milled portion provided in a border region between the housing and a plug flange of the plug-in connector, and further comprising a bonding connection between the plug-in connector and the housing having a conductive surface coating.

2. The housing arrangement in accordance with claim 1, wherein the housing has a cover, wherein the milled portion is provided at a connection of the cover to the housing.

3. The housing arrangement in accordance with claim 1, wherein the seal is press-fit into the milled portion.

4. The housing arrangement in accordance with claim 1, wherein the seal is ring-shaped.

5. The housing arrangement in accordance with claim 1, further comprising the surface coating including a non-conductive and resistant corrosion protection coating in a region of the milled portion between the housing and the plug-in connector.

6. The housing arrangement in accordance with claim 5, wherein the surface coating is anodized.

7. The housing arrangement in accordance with claim 6, wherein the surface coating is positioned in a region of the milled portion provided in the housing and/or in the cover of the housing.

8. The housing arrangement in accordance with claim 7, wherein the seal is ring shaped.

9. The housing arrangement in accordance with claim 1, wherein the housing houses electronics, the electronics coupled with components external to the housing via the plug-in connector.

10. The housing arrangement in accordance with claim 1, wherein the seal is in face sharing contact with the housing on one side and with the plug-in connector on an opposite side, with the milled portion retaining the seal.

11. The housing arrangement in accordance with claim 10, wherein the housing and the plug-in connector are in face-sharing contact outside of the seal, where each of the housing and the plug-in connector wrap around each other via two oppositely positioned L-shaped regions.

12. A housing arrangement, comprising:
a plug-in connector; and
a housing for connecting the plug-in connector, wherein the housing has at least one seal, wherein the at least one seal comprises a compressible material having an elastic portion positioned in a milled portion with vertical side walls provided in the housing, wherein the housing hermetically seals electronic components therein via the seal, wherein the housing has a cover, and wherein at least one milled portion is provided at a connection of the cover to the housing.

13. The housing arrangement in accordance with claim 12, wherein the seal is ring-shaped with a rectangular cross-section.

14. The housing arrangement in accordance with claim 13, further comprising a surface coating including a non-conductive and resistant corrosion protection coating in a region of the milled portion between the housing and the plug-in connector.

15. The housing arrangement in accordance with claim 12, further comprising a plurality of the plug-in connectors, each having a corresponding compressible seal positioned in a respective milled portion in the housing or a flange.

16. A housing arrangement, comprising:
a plug-in connector;
a housing for connecting the plug-in connector, wherein the housing has at least one seal, wherein the at least one seal comprises a compressible material having an elastic portion positioned in a milled portion with vertical side walls provided in a flange of the plug-in connector, wherein the housing hermetically seals electronic components therein via the seal; and a bonding connection between the plug-in connector and the housing having a conductive surface coating.

17. The housing arrangement in accordance with claim 16, further comprising the surface coating including a non-conductive and resistant corrosion protection coating in a region of the milled portion between the housing and the plug-in connector.

18. The housing arrangement in accordance with claim 17, wherein the surface coating is anodized.

19. The housing arrangement in accordance with claim 16, wherein the housing houses electronics, the electronics coupled with components external to the housing via the plug-in connector, where an outer portion of the housing directly is coupled to an ambient environment with pressure fluctuations.

\* \* \* \* \*